United States Patent [19]

Catherwood et al.

[11] Patent Number: 5,598,569

[45] Date of Patent: Jan. 28, 1997

[54] DATA PROCESSOR HAVING OPERATING MODES SELECTED BY AT LEAST ONE MASK OPTION BIT AND METHOD THEREFOR

[75] Inventors: Michael I. Catherwood; George L. Espinor, both of Austin, Tex.

[73] Assignee: Motorola Inc., Shaumburg, Ill.

[21] Appl. No.: 323,558

[22] Filed: Oct. 17, 1994

[51] Int. Cl.$^6$ .................................................. G06F 12/16
[52] U.S. Cl. .......................... 395/800; 395/180; 395/750; 364/DIG. 1; 364/DIG. 2; 364/707
[58] Field of Search .................... 364/DIG. 1, DIG. 2, 364/707; 395/800, 180, 750

[56] References Cited

U.S. PATENT DOCUMENTS

| | | | |
|---|---|---|---|
| 4,084,235 | 4/1978 | Hirtle et al. | 364/200 |
| 4,124,891 | 11/1978 | Weller, III et al. | 364/200 |
| 4,344,127 | 8/1982 | McDaniel et al. | 364/130 |
| 4,580,216 | 4/1986 | Bellay et al. | 364/200 |
| 4,794,558 | 12/1988 | Thompson | 364/900 |
| 4,807,189 | 2/1989 | Pinkham et al. | 365/189 |
| 4,817,058 | 3/1989 | Pinkham | 365/230 |
| 4,899,310 | 2/1990 | Baba et al. | 365/189.05 |
| 5,134,699 | 7/1992 | Aria et al. | 395/425 |
| 5,247,682 | 9/1993 | Kondou et al. | 395/700 |
| 5,261,049 | 11/1993 | Lumelsky et al. | 395/164 |
| 5,261,104 | 11/1993 | Bertram et al. | 395/700 |
| 5,319,606 | 6/1994 | Bowen et al. | 365/230.06 |
| 5,333,287 | 7/1994 | Buerkle et al. | 395/375 |
| 5,384,745 | 1/1995 | Konishi et al. | 365/230.03 |
| 5,406,064 | 4/1995 | Takahashi | 235/492 |
| 5,428,748 | 6/1995 | Davidson et al. | 395/275 |
| 5,528,535 | 6/1996 | Honjo et al. | 365/145 |

OTHER PUBLICATIONS

Motorola, Inc.; "Motorola System Product Technical Data, Advance Information 8–Bit Microcomputers: MC6805S2, MC6805S3, MC68705S3"; 1986; p. 5.

Motorola, Inc.; Advance Information, "MC68(7)05P Series 8–Bit Microcomputers"; Oct. 1984; pp. 9–1 through 9–6.

Motorola, Inc.; Advance Information, "MC68(7)05R/U Series 8–Bit Microcomputers"; Jan. 1984; pp. 9–1 through 9–6.

Motorola, Inc.; "HC08–MC68HC708XL36 Technical Summary;"1993; pp. 2–8 through 2–9.

*Primary Examiner*—Thomas G. Black
*Assistant Examiner*—Valerie Darbe
*Attorney, Agent, or Firm*—Paul J. Polansky

[57] ABSTRACT

A data processor (20) includes a nonvolatile memory system (25) which stores not only normal program memory (31), but also mask option bits (32), within a common array (30) of nonvolatile memory cells. A control circuit (40) of the nonvolatile memory system (25) detects when a central processing unit (21) is accessing the program memory (31). In response to either an end of reset signal or a refresh request signal, the control circuit (40) copies the mask option bits (32) into a volatile mask option register (44) only when the central processing unit (21) is not accessing the program memory (31). Otherwise, the control circuit (40) holds off the access to the mask option bits (32). The mask option register (44) provides signals to various circuits (28) to control their operation. Thus, the mask option bits (32) may be stored in nonvolatile form in the same array (30) as the program memory (31), enhancing reliability and reducing integrated circuit size.

14 Claims, 3 Drawing Sheets

DATA PROCESSOR HAVING OPERATING MODES SELECTED BY AT LEAST ONE MASK OPTION BIT AND METHOD THEREFOR

CROSS REFERENCE TO RELATED APPLICATION

Related subject matter is contained in a patent application Ser. No. 08/194,900 now U.S. Pat. No. 5,559,981, entitled "Pseudo Static Mask Option Register and Method Therefor" by Gregory A. Racino and Jeffrey R. Jorvig, filed Feb. 14, 1994, and assigned to the assignee hereof.

FIELD OF THE INVENTION

This invention relates generally to data processors, and more particularly, to a data processor with a mask option register for mode selection.

BACKGROUND OF THE INVENTION

Computer systems are classically defined as having a central processing unit, memory, and input/output devices. Recent advances in integrated circuit technology have allowed many of the classical computer functions to be integrated onto a single integrated circuit chip. These devices are known by a variety of terms such as microcontrollers, embedded controllers, microcomputers, and the like. However, they share a common characteristic in that they incorporate most classical computer functions on-chip. Because of their high level of integration, microcontrollers are ideal for applications such as automobile engine controllers, refrigerators, cellular telephones, remote controllers, and the like. In order to alleviate the need for external memory to store the operating program, microcontrollers commonly include nonvolatile memory in the form of read-only memory (ROM), programmable ROM (PROM), erasable programmable ROM (EPROM), electrically erasable programmable ROM (EEPROM of $E^2$PROM), or one-time programmable ROM (OTPROM).

These microcontrollers frequently operate in a variety of modes but may be customized for individual applications. For example, a microcontroller may selectively implement an instruction of the central processing unit's instruction set. Other examples of different operating modes include the selection of whether an on-chip peripheral is active, support of different clock oscillator types such as crystal or resistor-capacitor (RC) network, the selection of the function of input/output pins, and the selection of other electrical characteristics of the device.

Some of these microcontrollers have their modes customized through bits, known as mask option bits, stored in nonvolatile memory. These bits are collectively referred to as the mask option register, or MOR. The MOR bits can be programmed at the same time the on-chip nonvolatile memory is programmed, and thus the microcontroller may be customized for the application. The mask option bits form signals which are continuously driven to various circuits to select the operating modes.

There are three known approaches for implementing the MOR. In the first approach, known as the static latched design, mask option data is stored in a portion of a nonvolatile memory. The other portion is used to store the software and data required to operate the microcontroller. When the microcontroller receives a reset signal (due to powering up or the system forcing a reset to the microcontroller), the mask option information is read from the nonvolatile memory and stored in static latches which generally retain the state of the data during normal operation.

There are problems with the static latched design. First, the mask option signals are not valid until the reset signal is inactivated. Therefore, some types of mask options, such as the clock oscillator type, cannot be implemented in the static latched MOR design because the mask options must be valid during the reset sequence. Second, the states of the mask option bits are held in latches which may become corrupted under adverse conditions with no possibility of recovery.

The second approach, known as the continuous refresh approach, uses a separate nonvolatile memory whose contents are continuously sensed and latched. The continuous refresh design corrects the problems of the static latched design. First, the continuous refresh approach provides valid mask option bits prior to the inactivation of the reset signal. Second, the state of the nonvolatile memory bits are almost instantaneously reflected on the mask option signals, eliminating most of the susceptibility to electrical disturbances.

However, the continuous refresh approach has several disadvantages compared to the static latched approach. The continuous refresh design requires a significant amount of power because the nonvolatile memory bits are being sensed continuously, causing current to flow continuously through the nonvolatile memory cells. The magnitude of the current flowing through each of the nonvolatile memory bits is dependent on the type of fabrication process used to manufacture them. Another problem is decreased reliability. The constant sensing bias voltage applied to the nonvolatile memory cells tends to degrade their data retention time (how long the bit retains data). The data retention time is known to be dependent on the period of time the nonvolatile memory cell is biased.

The third approach, known as the pseudo static approach, solves the problems with both of the previous two approaches. In the pseudo static approach, the MOR bits are stored in a separate nonvolatile memory. Instead of continuous updating, however, the MOR bits are read (sensed) only periodically. This periodic reading prevents unrecoverable errors caused when an electrical disturbance corrupts the contents of the stored MOR bits. The pseudo static approach reduces power consumption by only periodically reading the contents of the nonvolatile memory cells. Additionally, the pseudo static MOR output signals are valid prior to the termination of reset.

However, two main problems with the pseudo static approach remain. Since the pseudo static approach uses a separate nonvolatile memory array, the circuitry in general is different. For example, the sense amplifiers in the main nonvolatile memory array, which may have several thousand bits, are designed for speed whereas the sense amplifiers for the MOR block, which may typically have eight bits, are designed for low power consumption. Thus, the operation of this block must be evaluated and its reliability guaranteed separately from the main nonvolatile memory block. Even if the nonvolatile memory cells themselves are the same as in the main array, the difference in sense amplifiers makes the overall operation different.

Second, the pseudo static approach requires a large amount of circuit area to implement the separate nonvolatile memory cells, sense amplifiers, and high voltage circuits. In addition to area, the extra circuitry consumes more power. While the pseudo static approach consumes less power than the continuous refresh approach, further reduction is desirable.

Thus, it would be desirable to have a microcontroller which operates in a variety of modes which may be configured at program time, and which operates reliably and without excessive circuit area and power consumption. The present invention provides such a microcontroller, and these and other features and advantages will be more clearly understood from the following detailed description taken in conjunction with the accompanying drawings.

DETAILED DESCRIPTION OF A PREFERRED EMBODIMENT

Figure 1:
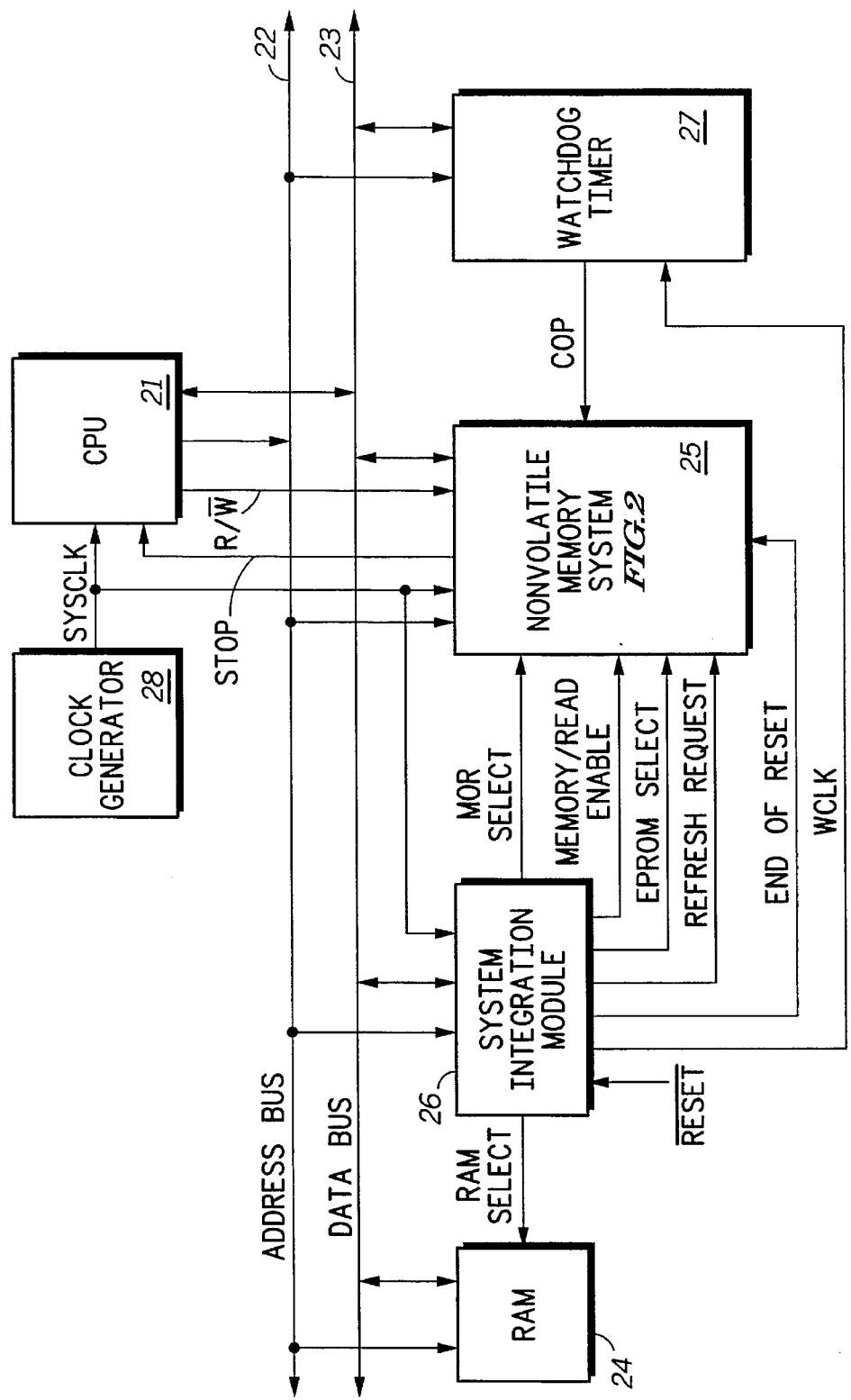
FIG. 1 illustrates in block diagram form a microcontroller according to the present invention.

FIG. 1 illustrates in block diagram form a microcontroller 20 according to the present invention. Microcontroller 20 is an integrated circuit microcontroller and includes a central processing unit (CPU) 21 connected to an address bus 22 and a bidirectional data bus 23. CPU 21 has an input terminal for receiving a clock signal labelled "SYSCLK" and an output terminal for providing a read/write control signal labelled "R/$\overline{W}$". CPU 21 also has other conventional input and output terminals but these are well known in the art and their description is omitted.

CPU 21 executes a program stored in nonvolatile memory system 25. Nonvolatile memory system 25 also stores the mask option bits associated with the operation of microcontroller 20. For example, in the illustrated embodiment, CPU 21 is an MC68HC05 family microprocessor available from Motorola, Inc. Nonvolatile memory system 25 provides one mask option bit, labelled "STOP", to CPU 21 to selectively enable the STOP instruction in the instruction set of CPU 21.

Microcontroller 20 also includes a random access memory (RAM) 24, a system integration module 26, a watchdog timer 27, and a clock generator 28. RAM 24 has an address input connected to address bus 22, and a bidirectional data connection to data bus 23. RAM 24 stores variables, measurements, operating parameters, and the like.

System integration module 26 performs many "glue logic" functions to allow microcontroller 20 to be used in various applications with little or no external hardware. System integration module 26 has an address input connected to address bus 22, a bidirectional connection to data bus 23, and a clock input for receiving signal SYSCLK. System integration module 26 provides outputs to several blocks in microcontroller 20. One such output is a signal labelled "END OF RESET", which system integration module 26 provides to nonvolatile memory system 25. Signal END OF RESET causes the static mask option bits in nonvolatile memory system 25 to be initially loaded into a volatile MOR register at the end of reset. System integration module 26 generates this signal in response to the end of a reset sequence initiated by an active-low external reset input signal labelled "$\overline{RESET}$".

Another such output signal is labelled "REFRESH REQUEST" which system integration module 26 provides to another input of nonvolatile memory system 25. System integration module 26 activates signal REFRESH REQUEST after a certain predefined number of SYSCLK cycles. The REFRESH REQUEST signal ensures that mask option bits stored in nonvolatile memory system 25 are periodically refreshed, or updated, so that the value stored in the volatile MOR register may recover after an event, such as external noise, corrupts its contents. Note that while system integration module 26 provides the REFRESH REQUEST signal in microcontroller 20, in other embodiments other blocks may generate the REFRESH REQUEST signal as well.

CPU 21 programs system integration module 26 to define the address spaces of RAM 24 and nonvolatile memory system 25. Conventionally, a startup or boot program is stored within nonvolatile memory system 25, and system integration module 26 defaults to setting the address range of nonvolatile memory system 25 to include the reset vector of CPU 21. Thereafter, CPU 21 may alter the address ranges by writing to the registers of system integration module 26. In response to detecting a memory access to RAM or nonvolatile memory space, system integration module 26 activates control signals labelled "EPROM SELECT" or "RAM SELECT", respectively. System integration module 26 also provides a control signal labelled "MEMORY READ ENABLE" to cause nonvolatile memory system 25 to provide its contents to data bus 23 when accessed.

System integration module 26 also has an output for providing a divided clock signal labelled "WCLK" to a watchdog timer 27. Watchdog timer 27 also has an address input connected to address bus 22, and a bidirectional connection to data bus 23. CPU 21 can thus program and read registers in watchdog timer 27 to control its operation. Watchdog timer 27 periodically generates a timing signal labelled "COP" to prevent system errors and for other timing functions.

Nonvolatile memory system 25 includes nonvolatile memory for storing the operating program of CPU 21, and also includes mask option bits. The mask option bits are memory-mapped and may be read by CPU 21. Thus, when system integration module 26 detects an access to this memory-mapped location, it activates a control signal labelled "MOR SELECT" and provides it to nonvolatile memory system 25.

Nonvolatile memory system 25 has an address input terminal connected to address bus 22, a bidirectional data terminal connected to data bus 23, a control input terminal for receiving signal R/W from CPU 21, control input terminals for receiving signals END OF RESET, REFRESEH REQUEST, MOR SELECT, and EPROM SELECT from system integration module 26, a control input terminal for receiving signal COP from watchdog timer 27, and output terminals for providing signals corresponding to each of the mask option bits. These signals will vary from application to application. Shown in FIG. 1 is a representative mask option signal STOP, which nonvolatile memory system 25 provides to CPU 21.

Nonvolatile memory system 25 improves reliability over the pseudo static approach by implementing the mask option bits with the program memory in a common nonvolatile memory cell array. The mask option bits share decoding, high voltage, and sense amplifier circuitry with the program memory and have the same reliability characteristics. Furthermore, nonvolatile memory system 25 allows the mask option bits to be stored with the program memory in a common nonvolatile memory cell array without adding the circuit area and thus power consumption of the extra blocks used in pseudo static approach.

Figure 2:
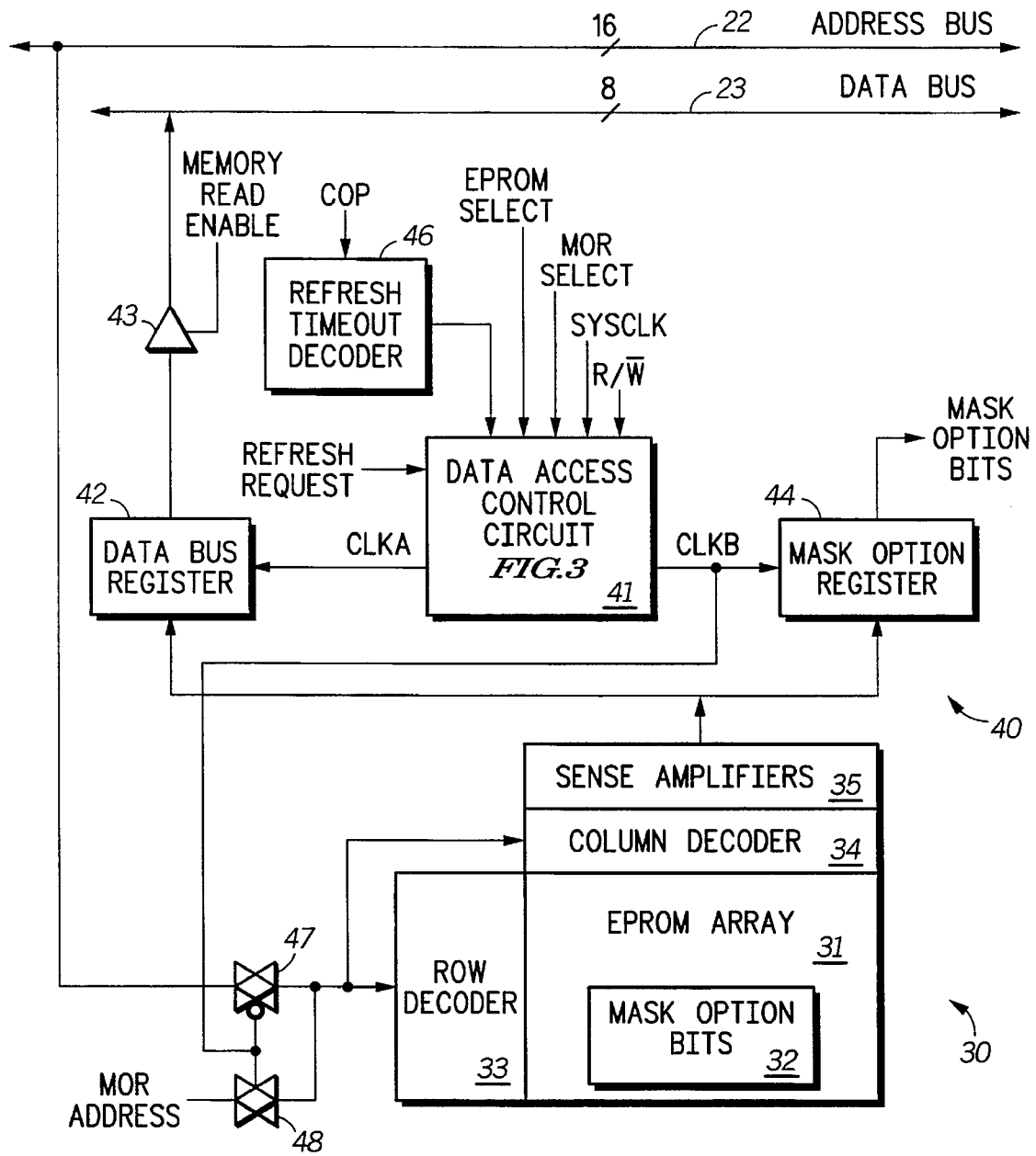
FIG. 2 illustrates in partial block and partial logic diagram form the nonvolatile memory system of FIG. 1.

FIG. 2 illustrates in partial block and partial logic diagram form nonvolatile memory system 25 of FIG. 1. Nonvolatile memory system 25 includes an array 30 of nonvolatile memory cells. Array 30 has two portions, a first portion for storing mask option bits 32, and a second portion including the remaining bits such as the operating program of CPU 21 labelled "EPROM ARRAY" 31. While the illustrated nonvolatile memory array is an array of EPROM cells, it should be apparent that other types of nonvolatile memory cells such as ROM, PROM, EEPROM, and OTPROM may be used as well.

Array 30 includes memory cells organized into rows and columns. Mask option bits 32 occupy part of one row and may be located anywhere in the address space of EPROM array 31. However, mask option bits 32 are preferably mapped into a memory location physically at the edge of EPROM array 31 to ease silicon debugging. Note that the address corresponding to this location is not necessarily the highest or lowest address of the address space of array 30. An access to array 30 uses conventional decoding techniques, in which a first portion of the address forms a row address and is input to a row decoder 33, and a second portion of the address forms a column address and is input to column decoder 34. A set of sense amplifiers 35 then sense the voltages provided by the memory cells selected by row decoder 33 and column decoder 34, and provide data output signals in response. In the illustrated embodiment, to support applications using very low power supply voltages, row decoder 33 and column decoder 34 also each include high voltage circuitry. The high voltage circuitry increases the power supply voltage to ensure proper accessing and sensing of voltage of selected bit lines. The high voltage circuitry includes charge pumps to increase the power supply voltage and thus the headroom of sense amplifiers 35 for fast accesses.

Nonvolatile memory system 25 also includes a data access circuit 40 which allows mask option bits 32 to be stored in a common array, namely array 30. Data access circuit 40 includes generally a data access control circuit 41, a data bus register 42, a three-state buffer 43, a mask option register 44, and transmission gates 47 and 48. Data access control circuit 41 has inputs for receiving signal SYSCLK from clock generator 28, signal R/$\overline{W}$ from CPU 21, signals REFRESH REQUEST, EPROM SELECT, and MOR SELECT from system integration module 26, and signal COP from watchdog timer 27. Data access control circuit 41 has a first output for providing a first control signal labelled "CLKA", and a second output for providing a second control signal labelled "CLKB".

Figure 3:
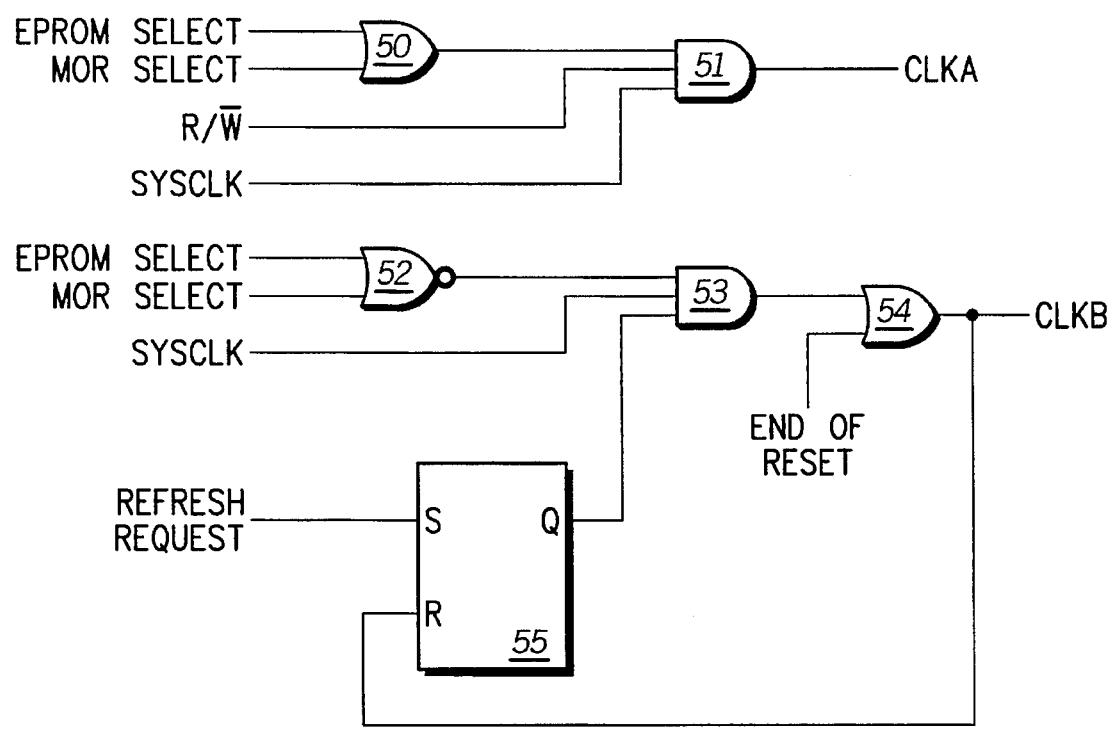
FIG. 3 illustrates in logic diagram form the data access control circuit of FIG. 2.

The operation of data access control circuit 41 may be better understood with reference to FIG. 3, which illustrates data access control circuit 41 in logic diagram form. Data access control circuit 41 includes an OR gate 50, an AND gate 51, a NOR gate 52, an AND gate 53, an OR gate 54, and a set-reset (SR) type flip-flop 55. OR gate 50 has a first input terminal for receiving signal EPROM SELECT, a second input terminal for receiving signal MOR SELECT, and an output terminal. AND gate 51 has a first input terminal connected to the output terminal of OR gate 50, a second input terminal for receiving signal R/$\overline{W}$, a third input terminal for receiving signal SYSCLK, and an output terminal for providing signal CLKA. Data access control circuit 41 thus provides signal CLKA when system integration module 26 detects a read access to EPROM array 31 or a read access to mask option bits 32, which is synchronized with the rising edge of signal SYSCLK.

NOR gate 52 has a first input terminal for receiving signal EPROM SELECT, a second input terminal for receiving signal MOR SELECT, and an output terminal. AND gate 53 has a first input terminal connected to the output terminal of NOR gate 52, a second input terminal for receiving signal SYSCLK, a third input terminal, and an output terminal. OR gate 54 has a first input terminal connected to the output terminal of AND gate 53, a second input terminal for receiving signal END OF RESET, and an output terminal for providing signal CLKB. Flip-flop 55 has a set input terminal labelled "S" for receiving signal REFRESH REQUEST, a reset input terminal labelled "R" for receiving signal CLKB, and a true output terminal labelled "Q" connected to the third input terminal of AND gate 53. Flip-flop 55 is set in response to signal REFRESH REQUEST and thus indicates a pending refresh request. Flip-flop 55 is not reset until the request is satisfied by the activation of signal CLKB, which occurs when system integration module 26 detects neither an access to EPROM array 31 nor an access to mask option bits 32. AND gate 53 further synchronizes signal CLKB to the rising edge of signal SYSCLK. OR gate 54 causes the activation of signal CLKB in response to the end of the reset sequence, or to a pending refresh request. It should be apparent that other logic circuitry may be used to implement the logical functions of data access control circuit 41 as well.

Returning now to FIG. 2, data bus register 42 has a data input terminal connected to sense amplifiers 35, a control input terminal for receiving signal CLKA from data access control circuit 41, and an output terminal. Data bus register 42 provides intermediate storage for the data read from array 30 so that a stable value may be presented to data bus 23. Three-state buffer 43 has an input terminal connected to the output of data bus register 42, a control input terminal for receiving signal MEMORY READ ENABLE, and an output terminal connected to data bus 23.

Mask option register 44 is a volatile register which stores a copy of mask option bits 32. Mask option register 44 has a data input terminal connected to sense amplifiers 35, a control input terminal for receiving signal CLKB, and an output terminal for providing the mask option bits.

Transmission gate 47 has a first terminal connected to address bus 22, a complementary control input terminal for receiving signal CLKB, and an output terminal connected to the input terminals of row decoder 33 and column decoder 34. Transmission gate 48 has a first terminal for receiving a value labelled "MOR ADDRESS", a true control input terminal for receiving signal CLKB, and an output terminal connected to the input terminals of row decoder 33 and column decoder 34. MOR ADDRESS includes the row and column address of mask option bits 32 in array 30.

During a normal access cycle to array 30, signal CLKB is inactive at a logic low, and signal CLKA is active. Transmission gate 47 is active and provides the address value from address bus 22 to the inputs of row decoder 33 and column decoder 34. Sense amplifiers 35 detect the accessed data value, which is latched in data bus register 42. During a refresh cycle, which is indicated by signal CLKB being active, transmission gate 48 is active to cause mask option bits 32 to be read out of array 30. At the same time, mask option register 44 latches mask option bits 32, completing the refresh cycle.

Certain software instructions may cause a refresh to be pending for a very long or indefinite period of time, such as when software executes a long loop which does not require CPU 21 to execute any idle cycles. While in such a routine, mask option register 44 could be corrupted by noise, and not be refreshed for a very long period of time. One technique to prevent this lengthy corruption from occurring is illustrated in FIG. 2, in which a refresh timeout decoder 46 detects such an occurrence. Preferably, refresh timeout decoder 46 activates its output to data access control circuit 41 when signal COP is activated a second time before data access control circuit 41 responds to a refresh request. In response to the activation of the output of refresh timeout decoder 46, data access control circuit 41 acts to force an access to mask option bits 32, and thus includes extra logic for this purpose not shown in FIG. 3.

Another technique may also be used to ensure that a refresh occurs even when the software is erroneously stuck in a tight loop. In this technique, EPROM array 31 is segmented into two halves, a left half and a right half. Preferably, the least significant address bit, or A0, is used to select between the halves. In this way, a two-byte opcode requires sequential fetches to each half. Data access circuit 40 updates the MOR bits when the half in which they are stored in is not being accessed. This technique would be preferred when EPROM array 31 is already organized into halves selected by A0.

In the illustrated embodiment, CPU 21 uses an 8-bit architecture; data bus 23 is eight bits wide. Address bus 22 is sixteen bits wide. However, these sizes are merely one example and the present invention is applicable to any arbitrary CPU architecture and bus sizes.

While the invention has been described in the context of a preferred embodiment, it will be apparent to those skilled in the art that the present invention may be modified in numerous ways and may assume many embodiments other than that specifically set out and described above. For example, any type of nonvolatile memory may be used including ROM, PROM, EPROM, EEPROM, OTPROM, and the like. Furthermore, the refresh request signal may be generated in a variety of ways, such as by an on-chip watchdog timer or as an external input signal. Also, the MOR may be greater than one byte in length. In this case, the refresh may require more than one cycle, but the most critical bits should be placed into a byte which is refreshed first. Accordingly, it is intended by the appended claims to cover all modifications of the invention which fall within the true spirit and scope of the invention.

We claim:

1. A data processor having operating modes configured at program time by at least one mask option bit, comprising:

a central processing unit coupled to an address bus and to a data bus, for accessing memory and for processing instructions; and a nonvolatile memory system coupled to said address and data buses, comprising:

an array of nonvolatile memory cells for storing a plurality of data bits and the at least one mask option bit;

a decoder coupled to said address bus, for selecting at least one memory cell of said array of nonvolatile memory cells in response to an address conducted on said address bus;

a sense amplifier having an input coupled to said decoder, and an output;

a coupling circuit having an input coupled to said output of said sense amplifier, a control input for receiving a first control signal, and an output coupled to said data bus, said coupling circuit providing a data bit to said data bus indicative of said output of said sense amplifier in response to said first control signal;

a mask option register comprising at least one static memory cell, having an input coupled to said output of said sense amplifier, a control input for receiving a second control signal and an output for providing the at least one mask option bit, said mask option register storing a data bit indicative of said output of said sense amplifier in response to said second control signal; and a control circuit coupled to said array of nonvolatile memory cells for activating copying of the at least one mask option bit from the array of nonvolatile memory cells to the mask option register in response to a refresh request signal when said central processing unit is not accessing said plurality of data bits;

whereby reliability of the data processor is improved by implementing the at least one mask option bit and said plurality of data bits in a common array.

2. The data processor of claim 1 wherein said control circuit further enables accesses to the at least one mask option bit in response to an end of a reset sequence initiated by a reset input signal when said central processing unit is not accessing said plurality of data bits.

3. The data processor of claim 1 wherein said control circuit further has inputs for receiving a read/write signal, a mask option register select signal, and first and second outputs for providing said first and second control signals.

4. The data processor of claim 3 further comprising a system integration module having an input for receiving a clock signal, and an output for periodically providing said refresh request signal.

5. The data processor of claim 4 wherein said control circuit further enables accesses to the at least one mask option bit in response to an end of reset signal when said central processing unit is not accessing said plurality of data bits, and wherein said system integration module further provides said end of reset signal in response to a reset input signal.

6. The data processor of claim 1 wherein said coupling circuit comprises:

a register having an input terminal coupled to said output of said sense amplifier, a control input terminal for receiving said first control signal, and an output terminal; and a buffer having an input terminal coupled to said output terminal of said register, and an output terminal coupled to said data bus.

7. The data processor of claim 6 wherein said buffer further has a control input terminal for receiving a third control signal, wherein said buffer is active in response to said third control signal.

8. The data processor of claim 1 wherein said decoder comprises:

a row decoder coupled to said address bus and to said array of nonvolatile memory cells, for selecting a row of nonvolatile memory cells in response to a first portion of an address conducted on said address bus; and a column decoder coupled to said address bus and to said array of nonvolatile memory cells, for providing a selected column of nonvolatile memory cells from said row selected of nonvolatile memory cells selected by said row decoder, to said sense amplifier, in response to a second portion of said address conducted on said address bus.

9. An integrated circuit data processor operating in one of first and second modes configured at program time by at least one mask option bit, comprising:

a central processing unit coupled to an address bus and to a data bus, for accessing memory and for processing instructions;

a nonvolatile memory having an address input coupled to said address bus, and a data output, said nonvolatile memory storing a plurality of data bits and the at least one mask option bit;

a mask option register comprising at least one static memory cell;

a data access circuit having a first input coupled to said data output of said nonvolatile memory, a second input for receiving a control signal, a first output coupled to said data bus, and a second output for providing the at least one mask option bit;

said data access circuit coupling said data output of said nonvolatile memory to said data bus in response to said central processing unit accessing one of said plurality of data bits;

said data access circuit enabling an access to the at least one mask option bit and storing said data output of said nonvolatile memory in a said mask option register thereof in response to a refresh request signal, when said central processing unit is not accessing one of said plurality of data bits;

whereby reliability of the data processor is improved by implementing the at least one mask option bit and said plurality of data bits in a common array.

10. The data processor of claim 9 wherein said data access circuit further enables accesses to the at least one mask option bit and stores said data output of said nonvolatile memory in said mask option register thereof in response to an end of a reset sequence initiated by a reset input signal when said central processing unit is not accessing said plurality of data bits.

11. The data processor of claim 9 wherein said data access circuit comprises:

a data access control circuit having an input for receiving said refresh request signal, a first output for providing a first control signal, and a second output for providing a second control signal;

said data access control circuit providing said first control signal in response to said central processing unit accessing one of said plurality of data bits;

said data access control circuit providing said second control signal in response to said refresh request signal, when said central processing unit is not accessing one of said plurality of data bits;

a data bus register having an input coupled to said data output of said nonvolatile memory, a control input for receiving said first control signal, and an output; and a buffer having an input coupled to said output of said data bus register, and an output coupled to said data bus;

said mask option register having an input coupled to said data output of said nonvolatile memory, and an output for providing the at least one mask option bit.

12. The data processor of claim 11 further comprising:

a refresh timeout decoder having an output connected to said data access control circuit, said refresh timeout decoder activating said output thereof in response to an occurrence of a predetermined condition;

said data access control circuit further preventing an access to said plurality of data bits, enabling an access to the at least one mask option bit, and storing said data output of said nonvolatile memory in said mask option register in response to an activation of said output of said refresh timeout decoder.

13. In a data processor having operating modes configured at program time by at least one mask option bit, the data processor comprising a central processing unit coupled to an address bus and to a data bus for accessing memory and for processing instructions, a mask option register having an output for providing the at least one mask option bit to other portions of the data processor, a system integration module coupled to said address and data buses, and a nonvolatile memory system coupled to said address and data buses, the improvement wherein:

said nonvolatile memory system and the said mask option register are implemented in the same integrated circuit and said mask option register is comprised of at least one static memory cell and said nonvolatile memory system further includes a common nonvolatile memory array having a first portion for storing the at least one mask option bit and a second portion for storing other data;

said system integration module periodically outputs a refresh request signal; and said nonvolatile memory system further includes a control input for receiving the refresh request signal and in response thereto, causing the at least one mask option bit to be copied from said nonvolatile memory array into the said mask option register.

14. The data processor of claim 13 wherein said nonvolatile memory system further causes the at least one mask option bit to be loaded into the mask option register in response to an end of a reset sequence initiated by a reset input signal when said central processing unit is not accessing said plurality of data bits.

* * * * *